(12) United States Patent
Kim et al.

(10) Patent No.: US 9,778,710 B2
(45) Date of Patent: Oct. 3, 2017

(54) ELECTRONIC DEVICE HAVING HEAT DISSIPATION STRUCTURE

(71) Applicant: Samsung Electronics Co., Ltd., Gyeonggi-do (KR)

(72) Inventors: Young-Gyun Kim, Gyeonggi-do (KR); Woong-Chan Kim, Gyeonggi-do (KR); Chang-Youl Lee, Seoul (KR); Tae-Doo Choung, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/089,414

(22) Filed: Apr. 1, 2016

(65) Prior Publication Data
US 2016/0313773 A1 Oct. 27, 2016

(30) Foreign Application Priority Data
Apr. 22, 2015 (KR) .................. 10-2015-0056784

(51) Int. Cl.
*H05K 7/20* (2006.01)
*G06F 1/20* (2006.01)
(Continued)

(52) U.S. Cl.
CPC .............. *G06F 1/203* (2013.01); *G06F 1/163* (2013.01); *G06F 1/1635* (2013.01);
(Continued)

(58) Field of Classification Search
CPC . G06F 1/181–1/182; H05K 7/20218–7/20381;
(Continued)

(56) References Cited

U.S. PATENT DOCUMENTS 8,016,430 B2 9/2011 Heo et al.
2005/0111194 A1* 5/2005 Sohn ................... H01L 23/3672
361/704
(Continued)

FOREIGN PATENT DOCUMENTS

JP 2010146774 A 7/2010

OTHER PUBLICATIONS

European Patent Office, "European Search Report" Application No. 16166259.8-1874, Sep. 26, 2016, 15 pages, publisher EPO, Munich, Germany.

*Primary Examiner* — Anthony Haughton
*Assistant Examiner* — Razmeen Gafur

(57) ABSTRACT

Provided is an electronic device that includes: a housing that includes a metallic member; a battery pack that is disposed in the housing; a substrate that is disposed in parallel with the battery pack and includes at least one heat generating source; a heat dissipation plate that is disposed to overlap with at least a portion of the battery pack and the substrate, and is formed of a metallic material. Heat generated from the heat generating source may be dissipated to the battery pack through the heat dissipation plate. The electronic device includes an efficient heat dissipation structure that also contributes to the rigidity reinforcement and slimming of the electronic device, and can prevent an electric shock accident beforehand, which may be caused by an exterior of a metallic member. Other various embodiments may be made.

19 Claims, 15 Drawing Sheets

(51) Int. Cl.
*H04B 1/036* (2006.01)
*G06F 1/16* (2006.01)
*G06F 1/18* (2006.01)
*H04M 1/02* (2006.01)

(52) U.S. Cl.
CPC .......... *G06F 1/1656* (2013.01); *G06F 1/1679* (2013.01); *G06F 1/1686* (2013.01); *G06F 1/1688* (2013.01); *G06F 1/189* (2013.01); *H04B 1/036* (2013.01); *H04M 1/0202* (2013.01); *H05K 7/20445* (2013.01); *H04M 2001/0204* (2013.01)

(58) Field of Classification Search
CPC ............... H05K 7/20409–7/20418; H05K 7/20009–7/202; H01L 23/367–23/3677; H01L 23/473; H01L 23/46–23/467
USPC ...... 361/676–678, 679.46–679.54, 688–723, 361/679.01–679.45, 679.55–679.61, 361/724–727; 164/80.1–80.5, 104.33, 164/185; 174/15.1–15.3, 16.1–16.3, 547, 174/548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2006/0274506 A1* | 12/2006 | Huang | ............... | H04B 1/036 361/704 |
| 2009/0310311 A1 | 12/2009 | Kondoh | | |
| 2010/0072952 A1* | 3/2010 | Nakajima | ............. | H04B 1/036 320/150 |
| 2010/0091439 A1* | 4/2010 | Horii | .................. | H04M 1/0249 361/679.01 |
| 2010/0258626 A1* | 10/2010 | Watanabe | .......... | H01M 2/1066 235/380 |
| 2011/0032668 A1* | 2/2011 | Lee | .................... | H04M 1/0239 361/679.01 |
| 2011/0199721 A1* | 8/2011 | Allen | ................. | H04M 1/0237 361/679.01 |
| 2011/0261510 A1* | 10/2011 | Liu | ...................... | G06F 1/1637 361/679.01 |
| 2011/0292578 A1* | 12/2011 | Lim | ................... | H04M 1/0239 361/679.01 |
| 2012/0026656 A1* | 2/2012 | Lee | ..................... | H01M 2/1066 361/679.01 |
| 2012/0039029 A1* | 2/2012 | Allen | ................. | H04M 1/0235 361/679.01 |
| 2012/0320503 A1* | 12/2012 | Yturralde | ............. | G06F 1/1628 361/679.01 |
| 2013/0016050 A1* | 1/2013 | Allore | ................ | H04M 1/185 345/173 |
| 2013/0027892 A1* | 1/2013 | Lim | ................... | H04M 1/185 361/748 |
| 2013/0058018 A1* | 3/2013 | Song | .................. | G06F 1/1626 361/679.01 |
| 2013/0182379 A1* | 7/2013 | Kim | ................... | H04M 1/0283 361/679.01 |
| 2013/0217443 A1* | 8/2013 | Lim | ................... | H04M 1/0216 455/566 |
| 2013/0250504 A1* | 9/2013 | Choi | .................. | G06F 1/203 361/679.26 |
| 2013/0265722 A1* | 10/2013 | Hill | ..................... | G06F 1/203 361/707 |
| 2014/0055962 A1* | 2/2014 | Kim | ................... | H05K 5/0086 361/748 |
| 2014/0146441 A1* | 5/2014 | Hautamaki | ........ | H04M 1/0262 361/679.01 |
| 2014/0146448 A1* | 5/2014 | Yoo | .................... | H04M 1/0249 361/679.01 |
| 2014/0177151 A1* | 6/2014 | Manda | ............... | H04M 1/0252 361/679.3 |
| 2014/0187295 A1* | 7/2014 | Kumar | ................ | H04M 1/04 455/575.1 |
| 2014/0193023 A1* | 7/2014 | Heo | .................... | H01Q 1/2283 381/391 |
| 2014/0233181 A1* | 8/2014 | Harms | ................ | G06F 1/1613 361/679.56 |
| 2014/0240911 A1* | 8/2014 | Cole | .................. | B29C 45/14311 361/679.3 |
| 2014/0247547 A1* | 9/2014 | Jung | .................... | H02J 7/025 361/679.26 |
| 2014/0313746 A1* | 10/2014 | Song | .................... | G06F 1/1637 362/362 |
| 2015/0131225 A1* | 5/2015 | Chang | ................. | G06F 1/203 361/679.54 |

* cited by examiner

ELECTRONIC DEVICE HAVING HEAT DISSIPATION STRUCTURE

CROSS-REFERENCE TO RELATED APPLICATION AND CLAIM OF PRIORITY

The present application is related to and claims the benefit of priority under 35 U.S.C. §119(a) to Korean Application Serial No. 10-2015-0056784, which was filed in the Korean Intellectual Property Office on Apr. 22, 2015, the entire content of which is hereby incorporated by reference.

TECHNICAL FIELD

Various embodiments of the present disclosure relate to an electronic device that includes a heat dissipation structure.

BACKGROUND

As the functional differences among respective manufacturers have narrowed considerably, electronic devices have been gradually slimmed in order to satisfy consumers' desires. There is a tendency to attempt to reinforce the rigidity of an electronic device and to strengthen a design feature. As a part of such a tendency, at least a portion of various structures of an electronic device (e.g., an exterior) is implemented using a metal so as to emphasize the high quality and the beauty of the exterior of the electronic device.

Further, the electronic device, which is being gradually slimmed, requires a structure that is capable of efficiently dissipating heat generated from internal parts.

SUMMARY

In order to reinforce the rigidity of an electronic device, which is being gradually slimmed, a separate plate type bracket may be disposed within the electronic device to include at least a portion of the electronic device. When a metallic member is used as such a bracket, the bracket may have a die-casted or pressed structure. Or, when the bracket is made of a synthetic resin, the bracket may have an injection-molded structure.

To address the above-discussed deficiencies, it is a primary object to provide an electronic device that includes a heat dissipation structure.

Various embodiments of the present disclosure provide an electronic device that includes a heat dissipation structure that is capable of efficiently transferring and dissipating heat generated from a heat generating source within the electronic device.

Various embodiments of the present disclosure provide an electronic device that includes a heat dissipation structure that is implemented to be capable of preventing electric shock beforehand.

Various embodiments of the present disclosure provide an electronic device that includes a heat dissipation structure that is capable of contributing to the slimming and rigidity reinforcement of the electronic device.

According to various embodiments, an electronic device includes: a housing that includes a metallic member; a battery pack that is disposed in the housing; a substrate that includes at least one heat generating source adjacent to the battery pack; and a heat dissipation plate that is disposed to overlap with at least a portion of the battery pack and the substrate, and is formed of a metallic material. Heat generated from the heat generating source may be dissipated to the battery pack and a peripheral structure through the heat dissipation plate.

According to various embodiments, an electronic device includes: a housing that includes a metallic member; a battery pack that is disposed in the housing; a substrate that is disposed in parallel with the battery pack and includes at least one heat generating source; a heat dissipation plate that is disposed above the battery pack and the substrate to overlap with at least a portion of the battery pack and the substrate, and is formed of a copper (Cu) alloy; and at least one insulation fastening member between the substrate and the metallic member of the housing or between the substrate and the heat dissipation plate. Heat generated from the heat generating source may be dissipated to the battery pack through the heat dissipation plate.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
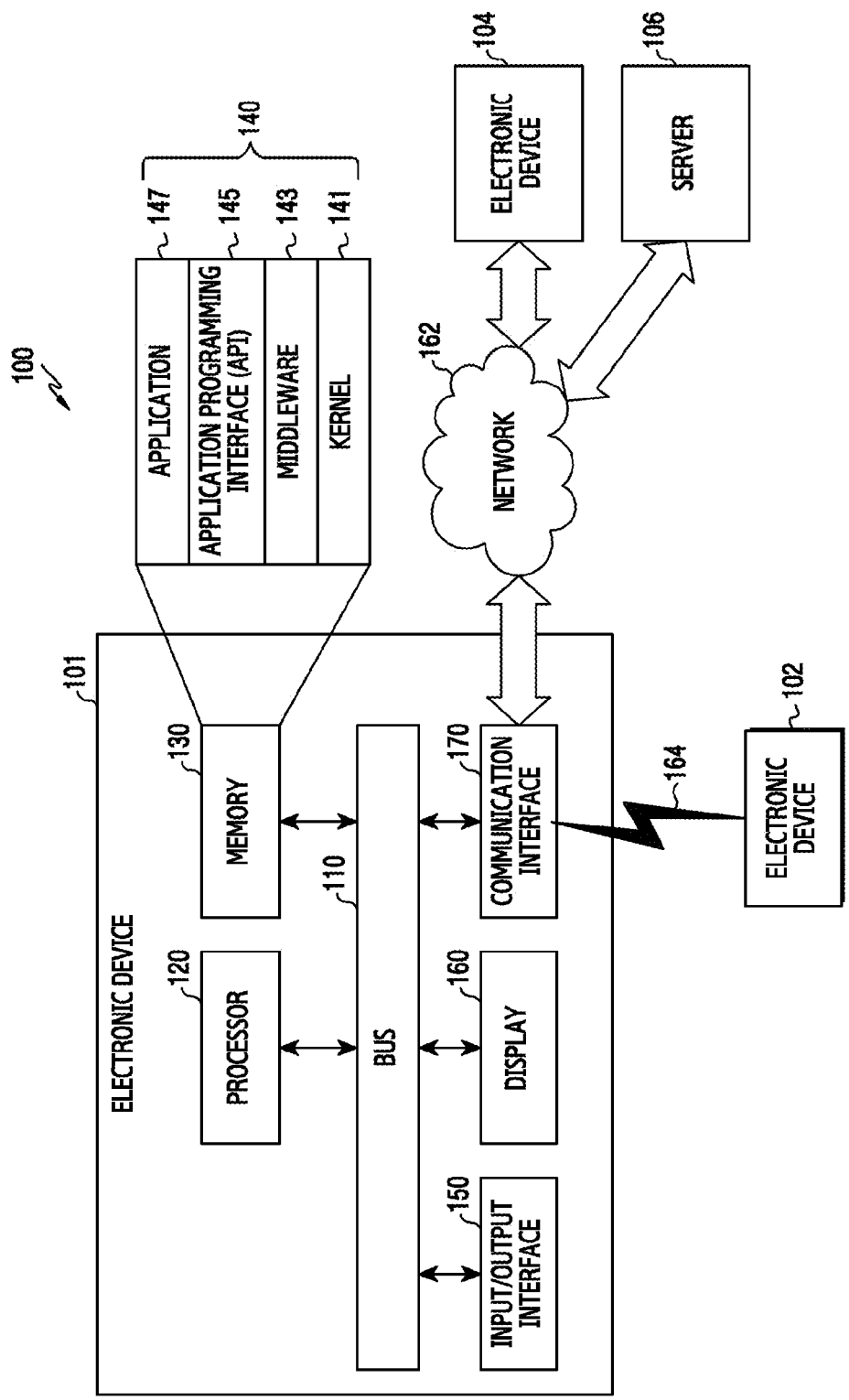
FIG. 1 illustrates a network environment that includes an electronic device according to various embodiments of the present disclosure.

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device. The following description, with reference to the accompanying drawings, is provided to assist in a comprehensive understanding of various embodiments of the present disclosure as defined by the claims and their equivalents. The description includes various specific details to assist in that understanding, but these details are to be regarded as merely examples. For example, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but are used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

Herein, singular forms such as "a," "an," and "the" include plural referents unless the context clearly dictates otherwise. Thus, for example, reference to "a component surface" includes reference to one or more of such surfaces.

The term "substantially" indicates that the recited characteristic, parameter, or value need not be achieved exactly, but that deviations or variations, including, for example, tolerances, measurement error, measurement accuracy limitations and other factors known to those of skill in the art, may occur in amounts that do not preclude the effect the characteristic was intended to provide.

The terms "have," "may have," "include," and "may include" indicate the presence of corresponding features, numbers, functions, parts, operations, elements, etc., but do not limit additional one or more features, numbers, functions, parts, operations, elements, etc.

The terms "A or B," "at least one of A or/and B", and "one or more of A or/and B" may include any and all combinations of words enumerated with it. For example, "A or B," "at least one of A and B", and "at least one of A or B" describe (1) including A, (2) including B, or (3) including both A and B.

Although terms, such as "first" and "second" as used herein may modify various elements of various embodiments of the present disclosure, these terms do not limit the corresponding elements. For example, these terms do not limit an order and/or importance of the corresponding elements. These terms may be used for the purpose of distinguishing one element from another element. For example, a first user device and a second user device both indicate user devices and may indicate different user devices. A first element may be referred to as a second element without departing from the scope of the present disclosure, and similarly, a second element may be referred to as a first element.

When an element (e.g., a first element) is "connected to" or "(operatively or communicatively) coupled with/to" another element (e.g., a second element), the first element may be directly connected or coupled to the second element, or there may be an intervening element (e.g., a third element) between the first element and the second element. However, when the first element is "directly connected" or "directly coupled" to the second element, there is no intervening element between the first element and the second element.

The expression "configured to (or set to)" may be replaced with "suitable for," "having the capacity to," "designed to," "adapted to," "made to," or "capable of" according to the situation. The term "configured to (or set to)" does not necessarily indicate "specifically designed to" in a hardware level. Instead, the expression "an apparatus configured to . . . " may indicate that the apparatus is "capable of . . . " along with other devices or parts in a certain situation. For example, "a processor configured to (set to) perform A, B, and C" may be a dedicated processor, e.g., an embedded processor, for performing a corresponding operation, or a generic-purpose processor, e.g., a central processing unit (CPU) or an application processor (AP), capable of performing a corresponding operation by executing one or more software programs stored in a memory device.

All the terms used herein, including technical and scientific terms, should be interpreted to have the same meanings as commonly understood by those skilled in the art to which the present disclosure pertains, and should not be interpreted to have ideal or excessively formal meanings, unless explicitly defined herein.

A module or programming module may include at least one constituent element among the described constituent elements of an apparatus, or may omit some of them, or may further include additional constituent elements. Operations performed by a module, programming module, or other constituent elements may be executed in a sequential, parallel, repetitive, or heuristic manner. In addition, some of the operations may be executed in a different order or may be omitted, or other operations may be added.

Herein, an electronic device may be a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), a moving picture experts group phase 1 or phase 2 (MPEG-1 or MPEG-2) audio layer 3 (MP3) player, a mobile medical device, a camera, or a wearable device (e.g., a head-mounted-device (HMD), electronic glasses, electronic clothing, an electronic bracelet, an electronic necklace, an electronic appcessory, an electronic tattoo, a smart mirror, a smart watch, etc.).

An electronic device may also be a smart home appliance, e.g., a television (TV), a digital versatile disc (DVD) player, an audio component, a refrigerator, an air conditioner, a vacuum cleaner, an oven, a microwave oven, a washing machine, an air cleaner, a set-top box, a home automation control panel, a security control panel, a TV box (e.g., Samsung HomeSync®, Apple TV®, or Google TV®), a game console (e.g., Xbox® or PlayStation®), an electronic dictionary, an electronic key, a camcorder, an electronic frame, and the like.

An electronic device may also be medical equipment, such as a mobile medical device (e.g., a blood glucose monitoring device, a heart rate monitor, a blood pressure monitoring device, a temperature meter, etc.), a magnetic resonance angiography (MRA) machine, a magnetic resonance imaging (MRI) machine, a computed tomography (CT) scanner, an ultrasound machine, etc., a navigation device, a GPS receiver, an event data recorder (EDR), a flight data recorder (FDR), an in-vehicle infotainment device, electronic equipment for a ship (e.g., a ship navigation equipment and/or a gyrocompass), avionics equipment, security equipment, a head unit for vehicle, an industrial or home robot, an automatic teller machine (ATM), a point of sale (POS) device, or an Internet of things (IoT) device (e.g., a light bulb, various sensors, an electronic meter, a gas meter, a sprinkler, a fire alarm, a thermostat, a streetlamp, a toaster, a sporting equipment, a hot-water tank, a heater, a boiler, etc.)

An electronic device may also be a piece of furniture, a building/structure, an electronic board, an electronic signature receiving device, a projector, and/or various measuring instruments (e.g., a water meter, an electricity meter, a gas meter, a wave meter, and the like).

An electronic device may also be a combination of one or more of the above-mentioned devices. Further, it will be apparent to those skilled in the art that an electronic device is not limited to the above-mentioned examples.

Herein, the term "user" may indicate a person who uses an electronic device or a device (e.g., an artificial intelligence electronic device) that uses the electronic device.

An electronic device of a single radio environment can provide LTE service using circuit switched fall back (CSFB) that determines whether paging information of a circuit switched (CS) service network is received over an LTE network. When receiving a paging signal of the CS service network over the LTE network, the electronic device connects (or accesses) the CS service network (e.g., a 2nd generation (2G)/3rd generation (3G) network) and provides a voice call service. For example, the 2G network can include one or more of a GSM network and a code division multiple access (CDMA) network. The 3G network can include one or more of a wideband-CDMA (WCDMA) network, a time division-synchronous CDMA (TD-SCDMA) network, and an evolution-data optimized (EV-DO) network.

Alternatively, the electronic device of the single radio environment can provide LTE service using single radio LTE (SRLTE), which determines whether the paging information is received by periodically switching every radio resource (e.g., receive antennas) to the CS service network (e.g., the 2G/3G network). Upon receiving the paging signal of the CS service network, the electronic device provides the voice call service by connecting the CS service network (e.g., the 2G/3G network).

Alternatively, the electronic device of the single radio environment can provide LTE service using single radio dual system (SRDS), which determines whether the paging information is received by periodically switching some of radio resources (e.g., receive antennas) to the CS service network (e.g., the 2G/3G network). Upon receiving the paging signal of the CS service network, the electronic device provides the voice call service by connecting the CS service network (e.g., the 2G/3G network).

FIG. 1 illustrates a network environment including an electronic device according to an embodiment of the present disclosure. Referring to FIG. 1, an electronic device 101 includes a bus 110, a processor 120, a memory 130, an input/output interface 150, a display 160, and a communication interface 170. Alternatively, the electronic device 100 can omit at least one of the components and/or include an additional component.

The bus 110 includes a circuit for connecting the components (e.g., the processor 120, the memory 130, the input/output interface 150, the display 160, and the communication interface 170) and delivering communications (e.g., a control message) therebetween.

The processor 120 includes one or more of a CPU, an AP, and a communication processor (CP). The processor 120 processes an operation or data for control of and/or communication with another component of the electronic device 101.

The processor 120, which may be connected to the LTE network, determines whether a call is connected over the CS service network using caller identification information (e.g., a caller phone number) of the CS service network (e.g., the 2G/3G network). For example, the processor 120 may receive incoming call information (e.g., a CS notification message or a paging request message) of the CS service network over the LTE network (e.g., CSFB). For example, the processor 120 being connected to the LTE network may receive incoming call information (e.g., a paging request message) over the CS service network (e.g., SRLTE).

When receiving the incoming call information (e.g., a CS notification message or a paging request message) of the CS service network over the LTE network, the processor 120 may obtain caller identification information from the incoming call information. The processor 120 displays the caller identification information on its display 160. The processor 120 may determine whether to connect the call based on input information corresponding to the caller identification information displayed on the display 160. For example, when detecting input information corresponding to an incoming call rejection, through the input/output interface 150, the processor 120 may restrict the voice call connection and maintains the LTE network connection. For example, when detecting input information corresponding to an incoming call acceptance, through the input/output interface 150, the processor 120 connects the voice call by connecting to the CS service network.

When receiving the incoming call information (e.g., a CS notification message or a paging request message) of the CS service network over the LTE network, the processor 120 may obtain caller identification information from the incoming call information. The processor 120 may determine whether to connect the call by comparing the caller identification information with a reception control list. For example, when the caller identification information is included in a first reception control list (e.g., a blacklist), the processor 120 may restrict the voice call connection and maintains the connection to the LTE network. For example, when the caller identification information is not included in the first reception control list (e.g., the blacklist), the processor 120 may connect the voice call by connecting to the CS service network. For example, when the caller identification information is included in a second reception control list (e.g., a white list), the processor 120 connects the voice call by connecting to the CS service network.

When receiving the incoming call information (e.g., a paging request message) of the CS service network over the LTE network, the processor 120 may transmit an incoming call response message (e.g., a paging response message) to the CS service network. The processor 120 may suspend the LTE service and receives the caller identification information (e.g., a CS call (CC) setup message) from the CS service network. The processor 120 may determine whether to connect the call by comparing the caller identification information with the reception control list. For example, when the caller identification information is included in the first reception control list (e.g., the blacklist), the processor 120 may restrict the voice call connection and resumes the LTE network connection. For example, when the caller identification information is not included in the first reception control list (e.g., the blacklist), the processor 120 may connect the voice call by connecting to the CS service network. For example, when the caller identification information is included in the second reception control list (e.g., the white list), the processor 120 connects the voice call by connecting to the CS service network.

The memory 130 may include volatile and/or nonvolatile memory. The memory 130 may store commands or data (e.g., the reception control list) relating to at least another component of the electronic device 101. The memory 130 stores software and/or a program 140. The program 140 includes a kernel 141, middleware 143, an application programming interface (API) 145, and applications 147. At least some of the kernel 141, the middleware 143, and the API 145 may be referred to as an operating system (OS).

The kernel 141 may control or manage system resources (e.g., the bus 110, the processor 120, or the memory 130) used for performing an operation or function implemented by the other programs (e.g., the middleware 143, the API 145, or the applications 147). Further, the kernel 141 provides an interface through which the middleware 143, the API 145, or the applications 147 may connect the individual elements of the electronic device 101 to control or manage the system resources.

The middleware 143 may function as an intermediary for the API 145 or the applications 147 to communicate with the kernel 141 and exchange data. In addition, the middleware 143 may process one or more task requests received from the applications 147 according to priorities thereof. For example, the middleware 143 may assign priorities for using the system resources (e.g., the bus 110, the processor 120, the memory 130, and the like) of the electronic device 101, to at least one of the applications 147. For example, the middleware 143 may perform scheduling or load balancing on the one or more task requests by processing the one or more task requests according to the priorities assigned thereto.

The API 145 is an interface through which the applications 147 control functions provided from the kernel 141 or the middleware 143, and may include at least one interface or function (e.g., an instruction) for file control, window control, image processing, text control, etc.

The input/output interface 150 transfers instructions or data input from a user or another external device to the other element(s) of the electronic device 101. Further, the input/output interface 150 outputs the instructions or data received from the other element(s) of the electronic device 101 to the user, a first external electronic device 102, a second external electronic device 104, or a server 106.

The display 160 may include a liquid crystal display (LCD), a light emitting diode (LED) display, an organic LED (OLED) display, a micro electro mechanical system (MEMS) display, an electronic paper display, etc. The display 160 displays various types of content (e.g., a text, images, videos, icons, symbols, webpages, etc.) for the user. The display 160 may include a touch screen that receives a touch input, a gesture input, a proximity input, a hovering input, etc., from an electronic pen or the user's body part.

The communication interface 170 establishes communication between the electronic device 101 and the first external electronic device 102, the second external electronic device 104, or the server 106. For example, the communication interface 170 can communicate with the first external electronic device 102 through a wireless communication or a wired communication 164, and communicate with the second external electronic device 104 or the server 106 in connection to a network 162 through wireless communication or wired communication. For example, the wireless communication may conform to a cellular communication protocol including at least one of LTE, LTE-advanced (LTE-A), CDMA, Wideband CDMA (WCDMA), universal mobile telecommunications system (UMTS), wireless broadband (WiBro), and GSM.

The wired communication 164 can include at least one of universal serial bus (USB), high definition multimedia interface (HDMI), recommended standard 232 (RS-232), and plain old telephone service (POTS).

The network 162 may include a telecommunications networks, a computer network (e.g., a local area network (LAN) or a wide area network (WAN)), the Internet, a telephone network, etc.

The electronic device 101 provides the LTE service in the single radio environment by use of at least one module functionally or physically separated from the processor 120.

Various embodiments of the present disclosure will be described with reference to a display that includes a bent or curved area and is applied to a housing of an electronic device 101, in which a non-metal member and a metal member (e.g., a metal bezel) are formed through dual injection molding, but are not limited thereto. For example, the display 160 may be applied to a housing, in which a metal member or a non-metal member is formed of a single material.

Each of the first external electronic device 102 and the second external electronic device 104 may be a same or a different type of device as the electronic device 101.

The server 106 may include a group of one or more servers.

All or some of the operations to be executed by the electronic device 101 may be executed by the first external electronic device 102, the second external electronic device 104, and/or the server 106. For example, when the electronic device 101 should perform a certain function, the electronic device 101 may request some functions that are associated therewith from the first external electronic device 102, the second external electronic device 104, and/or the server 106, instead of or in addition to executing the function or service by itself. The first external electronic device 102, the second external electronic device 104, or the server 106 may execute the requested functions or additional functions, and may transmit the results to the electronic device 101. The electronic device 101 may provide the requested functions or services by processing the received results as they are or after additionally. For example, a cloud computing technique, a distributed computing technique, or a client-server computing technique may be used.

Figure 2A:
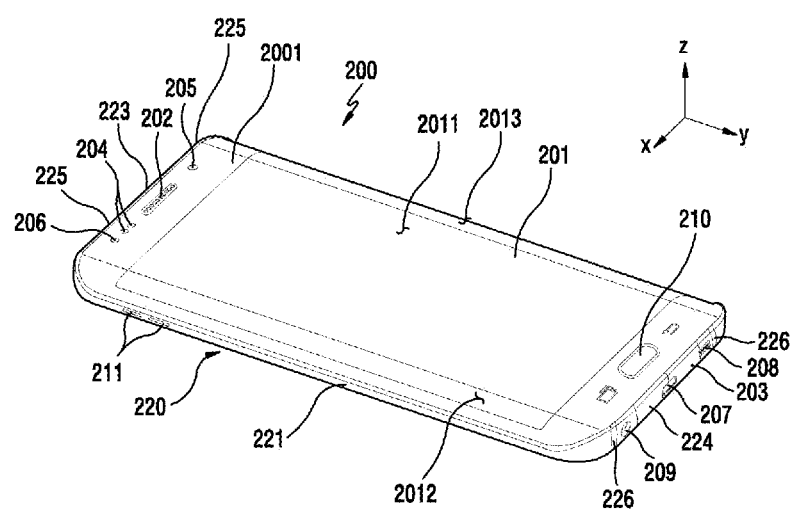
FIG. 2A illustrates a perspective view of a front side of the electronic device according to various embodiments of the present disclosure.
Figure 2B:
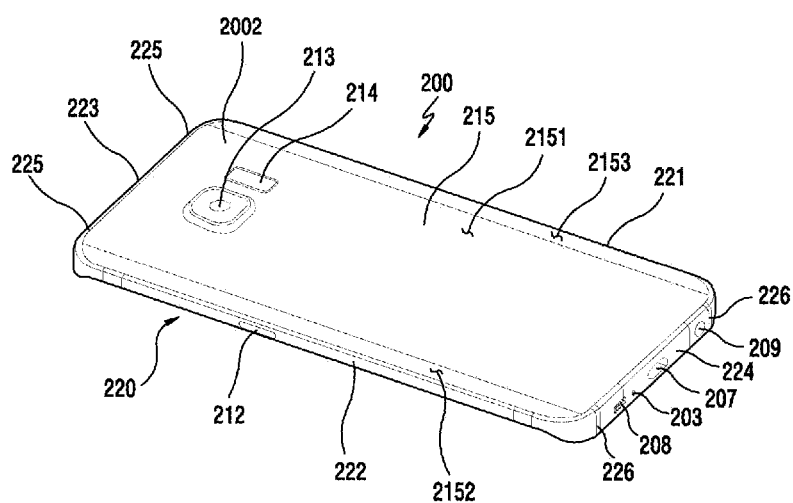
FIG. 2B illustrates a perspective view of a rear side of the electronic device according to various embodiments of the present disclosure.

FIG. 2A is a perspective view illustrating a front side of the electronic device 200 according to various embodiments of the present disclosure. FIG. 2B is a perspective view illustrating a rear side of the electronic device 200 according to various embodiments of the present disclosure.

Referring to FIGS. 2A and 2B, a display 201 may be provided on the front face 2001 of the electronic device 200. A receiver 202 may be disposed above the display 201 so as to receive a voice of a counterpart. A microphone device 203 may be disposed below the display 201 so as to transmit a voice of the user of the electronic device 200.

According to one embodiment, components for conducting various functions of the electronic device 200 may be disposed around the receiver 202 that is provided on the electronic device 200. The components may include at least one sensor module 204. The sensor module 204 may include at least one of, for example, an illuminance sensor (e.g., an optical sensor), a proximity sensor (e.g., an optical sensor), an infrared sensor, and an ultrasonic sensor. According to one embodiment, the components may include a front camera device 205. According to one embodiment, the components may include an indicator 206 that informs the user of the status information of the electronic device 200.

According to various embodiments, the electronic device 200 may include a metal bezel 220 as a metal housing. According to one embodiment, the metal bezel 220 may be disposed along the rim of the electronic device 200, or may be disposed on the rim to expand to at least a portion of the rear face 2002 of the electronic device 200 that extends from the rim. According to one embodiment, the metal bezel 220 defines at least a portion of the thickness of the electronic device 200 along the rim of the electronic device 200, and may be formed in a closed loop shape. Without being limited thereto, however, the metal bezel 220 may be formed to serve as at least a portion of the thickness of the electronic device 200. According to one embodiment, the metal bezel 220 may be formed on only a portion of the rim of the electronic device 200. According to one embodiment, when the metal bezel 220 serves as a portion of the housing of the electronic device 200, the remaining portion of the housing may be replaced by a non-metallic member. In such a case, the housing may be formed by insert injection molding the non-metallic member on the metal bezel 220. According to one embodiment, the metal bezel 220 may include one or more split portions 225 and 226 such that a unit bezel section, which is separated by the split portions 225 and 226, may be used as an antenna radiator. According to one embodiment, an upper bezel section 223 may serve as a unit bezel section by a pair of split portions 225 that are formed at a predetermined interval. According to one embodiment, a lower bezel section 224 may serve as a unit bezel section by a pair of split portions 226 that are formed at a predetermined interval. According to one embodiment, the split portions 225 and 226 may be formed in unison when the non-metallic member is molded on the metallic member through insert injection molding.

According to various embodiments, the metal bezel 220 has a closed loop shape along the rim, and may be arranged to serve as the whole of the thickness of the electronic device 200. According to one embodiment, when viewed from the front side of the electronic device 200, the metal bezel 220 may include a left bezel section 221, a right bezel section 222, an upper bezel section 223, and a lower bezel section 224.

According to various embodiments, various electronic components may be disposed on the lower bezel section 224 of the electronic device. According to one embodiment, a speaker device 208 may be disposed at one side of the microphone device 203. According to one embodiment, at the other side of the microphone device 203, an interface connector port 207 may be disposed in order to perform a transmission/reception function of an external device and to receive external power to charge the electronic device 200. According to one embodiment, an ear jack hole 209 may be disposed at one side of the interface connector port 207. According to one embodiment, all the above mentioned microphone device 203, speaker device 208, the interface connector port 207, and the ear jack hole 209 may be disposed within the region of the unit bezel section that is formed by a pair of split portions 226 disposed in the lower bezel section 224. Without being limited thereto, however, at least one of the above-mentioned electronic components may be disposed within a region that includes the split portion 226 or outside the unit bezel section.

According to various embodiments, various electronic components may be disposed on the upper bezel section 223 of the electronic device 200. According to one embodiment, a socket device (not shown) may be disposed on the upper bezel section 223 in order to insert a card type external device into the socket device 216. According to one embodiment, the socket device may accommodate at least one of an intrinsic ID card (e.g., a SIM card or a UIM card) for the electronic device and a memory card for storage space expansion. Without being limited thereto, however, at least one of the above-mentioned electronic components may be disposed within a region that includes the split portions 225 or outside the split portions.

According to various embodiments, on the left bezel section 221 of the metal bezel 220, one or more first side key buttons 211 may be disposed. According to one embodiment, the one or more first side key buttons 211 may be disposed in one pair to protrude on the left bezel section 221 so as to serve to perform a volume up/down function, a scroll function, or the like. According to one embodiment, on the right bezel section 222 of the metal bezel 220, one or more second side key buttons 212 may be disposed. According to one embodiment, the second side key buttons 212 may serve to perform a power ON/OFF function, an electronic device wake-up/slip function, or the like. According to one embodiment, in the front face 2001 of the electronic device 200, at least one key button 210 may be disposed in at least a portion of the lower region, except the display. According to one embodiment, the key button 210 may perform a home key button function. According to one embodiment, a fingerprint recognition sensor device may be disposed on the top surface of the home key button. According to one embodiment, the home key button may serve to perform a first function (e.g., home screen return function or a wake-up/slip function) by an action of physically pressing the home key button, and may serve to perform a second function (e.g., a fingerprint recognition function) by an action of swiping the top surface of the home key button. Although not illustrated, touch pads may be disposed on the left and right of the key button 210 to perform a touch function.

According to various embodiments, a rear camera device 213 may be disposed on the rear face 2002 of the electronic device 200, and one or more electronic components 214 may be disposed at a side of the rear camera device 213. According to one embodiment, the one or more electronic components 214 may include at least one of, for example, an illuminance sensor (e.g., an optical sensor), a proximity sensor (e.g., an optical sensor), an infrared sensor, an ultrasonic sensor, a heart rate sensor, and a flash device.

According to various embodiments, the front face 2001 including the display 201 may include a flat face portion 2011, and a left bending portion 2012 and a right bending portion 2013, which are formed on the left and right of the flat face portion 2011, respectively. According to one embodiment, the front face 2001 of the electronic device 200 may include a display region 201 and all of the other regions (e.g., a black matrix (BM) region) by using a single window. According to one embodiment, the left and right bending portions 2012 and 2013 may be formed to extend in an x-axis direction of the electronic device 200 of FIG. 2A from the flat face portion 2011. According to one embodiment, each of the left and right bending portions 2012 and 2013 may serve as a portion of the side faces of the electronic device 200, In such a case, the left and right bending portions 2012 and 2013 may form the side faces of the electronic device 200 together with the left and right bezel sections 221 and 222 of the metal bezel 220. Without being limited thereto, however, the front face 2001 including the display 201 may include at least one of the left and right bending portions 2012 and 2013. According to one embodiment, the front face 2001 may be configured to include only the left bending portion 2012 along the flat face portion 2011, or to include only the right bending portion 2013 along the flat face portion 2011.

According to various embodiments, the front face 2001 may include a flexible display module that is applied to a window that includes the bending portions 2012 and 2013 on the left and right thereof, and at least a portion below the window. According to one embodiment, a region including the flexible display module may serve as a display region 201. According to one embodiment, the window may be formed through a method of simultaneously bending the top face and the rear face thereof (hereinafter, referred to as a "3D method"). Without being limited thereto, however, the window may be formed through a method of forming each of the left and right portions of the top face in a curved shape and forming the rear face as a flat face (hereinafter, referred to as a "2.5D" method). According to one embodiment, the window may be formed of a transparent glass material (e.g., sapphire glass) or a transparent synthetic resin material.

According to various embodiments, the electronic device 200 may control the display module to selectively display information. According to one embodiment, the electronic device 200 may control the display module to configure a screen only on the flat face portion 2011. According to one embodiment, the electronic device 200 may control the display module to configure a screen on any one of the left and right bending portions 2012 and 2013 together with the flat face portion 2011. According to one embodiment, the electronic device 200 may control the display module to configure a screen only on any one of the left and right bending portions 2012 and 2013, excluding the flat face portion 2011.

According to various embodiments, the whole of the rear face 2002 of the electronic device 200 may be formed by a single window 215. According to one embodiment, the rear face 2002 may include a flat face portion 2151 that is approximately centrally formed on the central portion of the rear face 2002, and a left bending portion 2152 and a right bending portion 2153, which are formed on the left and right of the flat face portion 2151, respectively. According to one embodiment, the window 215 may be configured through a two-and-a-half dimension (2.5D) method, in which each of the left and right bending portions 2152 and 2153 of the outer face is formed in a curved shape, and the rear face of the window 215 is formed as a flat face. Without being limited thereto, however, the window 215 may also be formed through a three dimension (3D) method like the window that is disposed on the front face 2001. According to one embodiment, each of the left and right bending portions 2152 and 2153 may serve as a portion of the side faces of the electronic device 200. In such a case, the left and right bending portions 2152 and 2153 may form the side faces of the electronic device 200 together with the left and right bezel sections 221 and 222 of the metal bezel 220. Without being limited thereto, however, the rear face 2002 may include only one of the left and right bending portions 2152 and 2153. According to one embodiment, the rear face 2002 may be configured to include only the left bending portion 2152 along the flat face portion 2151, or to include only the right bending portion 2153 along the flat face portion 2151.

According to various embodiments, the upper left and right corner portions and lower left and right corner portions of the front face 2001 may be formed to be simultaneously inclined in the x-axis direction, y-axis direction, and z-axis direction in FIG. 2A while the window is bent. With this shape, the upper left and right corner portions and lower left and right corner portions of the metal bezel 220 may be formed such that the heights of the side faces thereof are gradually lowered.

According to various embodiments, the electronic device may generate heat of a high temperature by the electronic components that are mounted within the electronic device. The heat may be efficiently transferred and dissipated to the battery pack by the heat dissipation plate that is disposed in order to reinforce the rigidity.

Figure 3A:
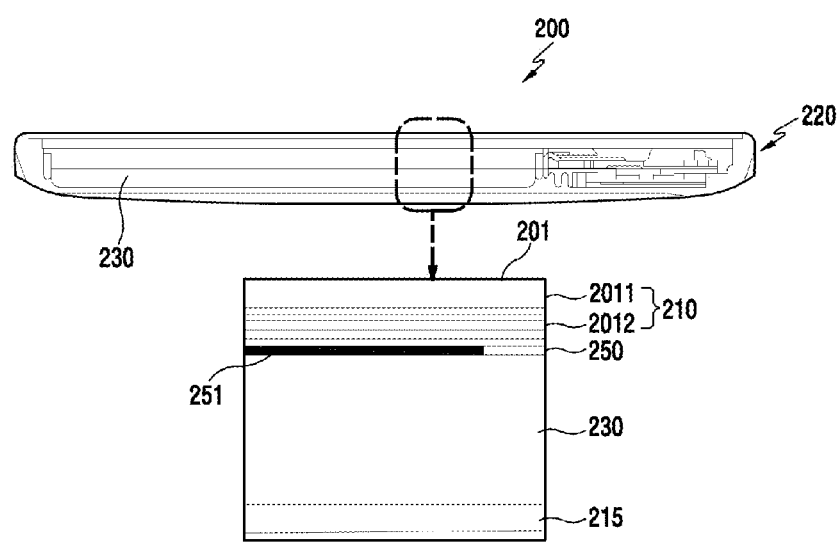
FIG. 3A illustrates a cross-sectional view of a main portion of the electronic device according to various embodiments.

FIG. 3A is a cross-sectional view illustrating a main portion of the electronic device 200 according to various embodiments of the present disclosure.

Referring to FIG. 3A, the electronic device 200 may include a battery pack 230 that is disposed within a housing that includes a metal bezel 220. A heat dissipation plate 250 may be disposed above the battery pack 230, and a display 201 may be disposed above the heat dissipation plate 250 in a stacked method. According to one embodiment, the display 201 may include a window 2011 at the upper side and a display module (which may include a touch sensor) 2012 that is disposed below the window 2011. According to one embodiment, a rear window 215 may be further disposed below the battery pack 230. Without being limited thereto, however, the rear window 215 may be replaced by a rear cover that is integrally formed with the metal bezel 220 or an attachable/detachable battery cover.

According to various embodiments, the heat dissipation plate 250 may be disposed such that at least a portion thereof overlaps with the battery pack 230 to be in contact with the battery pack 230. According to one embodiment, the heat dissipation plate 250 may further include an opening (a swelling gap) 251 for accommodating a swelling phenomenon that is caused by long use of the battery pack 230

Figure 3B:
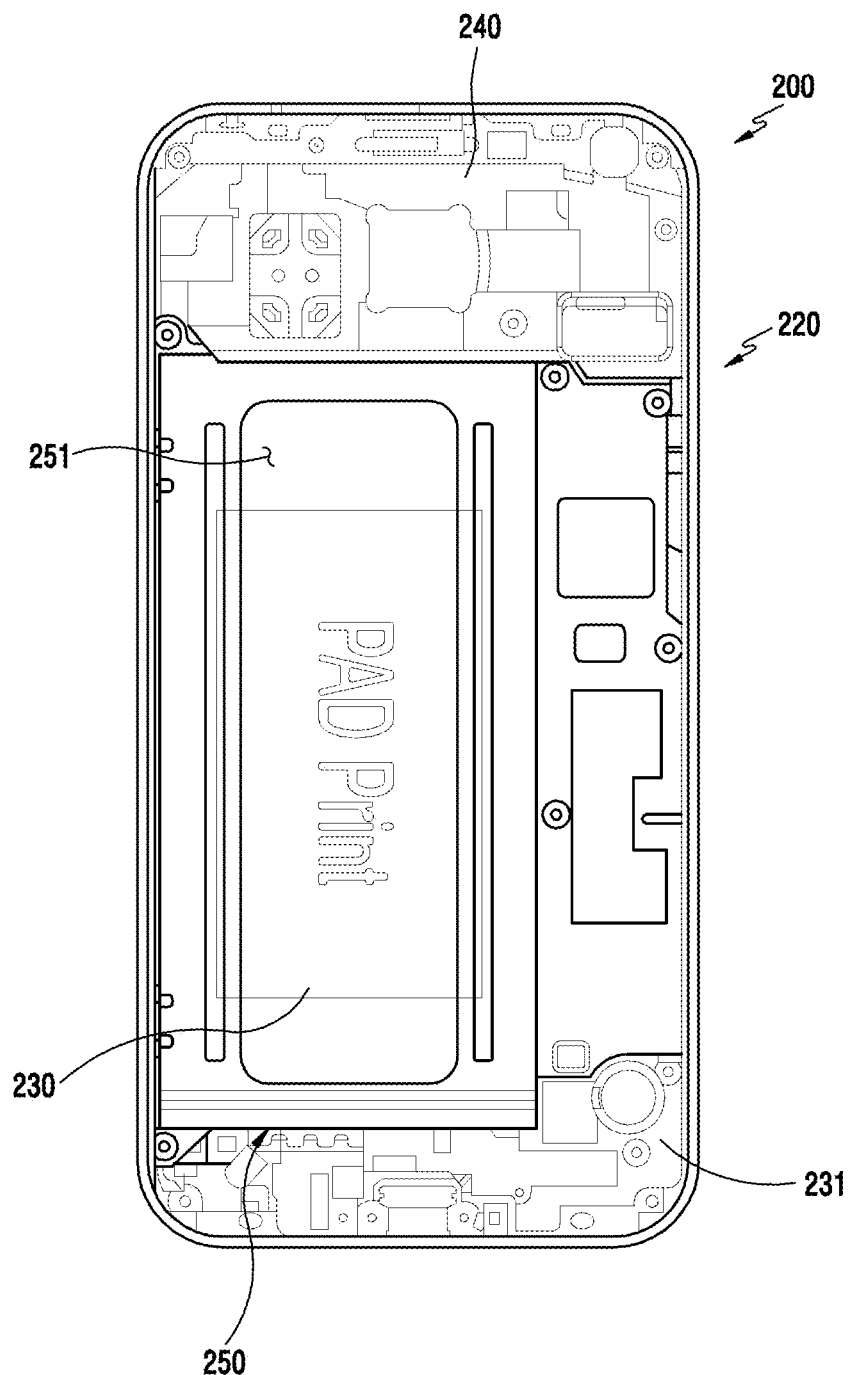
FIG. 3B illustrates a configuration of an electronic device including a heat dissipation plate installed therein, according to various embodiments of the present disclosure.

FIG. 3B illustrates a configuration of an electronic device 200 that is provided with the heat dissipation plate 250, according to various embodiments of the present disclosure.

Referring to FIG. 3B, the heat dissipation plate 250 may be formed to have a width size that approximately corresponds to that of the electronic device 200 internally within the electronic device 200, and to have a length that is shorter than that of the electronic device 200. Without being limited thereto, however, the heat dissipation plate 250 may be formed in various sizes depending on the shape of the electronic device 200. According to one embodiment, the heat dissipation plate 250 serves as a plate that forms the internal structure in the present embodiment. However, in some cases, the plate may be assembled to an exterior housing, or to be integrated with the exterior housing so as to be seen as a single piece, or so as to form a single piece structure.

According to various embodiments, the electronic device 200 may include a metal bezel 220 that is disposed at least along the rim of the electronic device 200, and a non-metallic member 240 may be molded, through insert injection molding, to the metal bezel 220 to be formed as a single structure with the metal bezel 220. According to one embodiment, the electronic device 200 may be mounted with a battery pack 230, and a printed circuit board (PCB) 231 may be disposed in parallel with the battery pack 230 to avoid the battery pack 230. According to one embodiment, the PCB 231 may include a main heat generating source (e.g., an AP). Accordingly, the heat dissipation plate 250 may be disposed such that it overlaps with at least a portion of each of the heat generating source of the PCB 231 and the battery pack 230. According to one embodiment, the heat dissipation plate 250 may be disposed such that it is in contact with at least a portion of the battery pack 230. According to one embodiment, the opening 251, which is formed in the heat dissipation plate 250 to handle the swelling phenomenon may be disposed in a region that generally overlaps with the central portion of the battery pack 230.

Figure 4A:
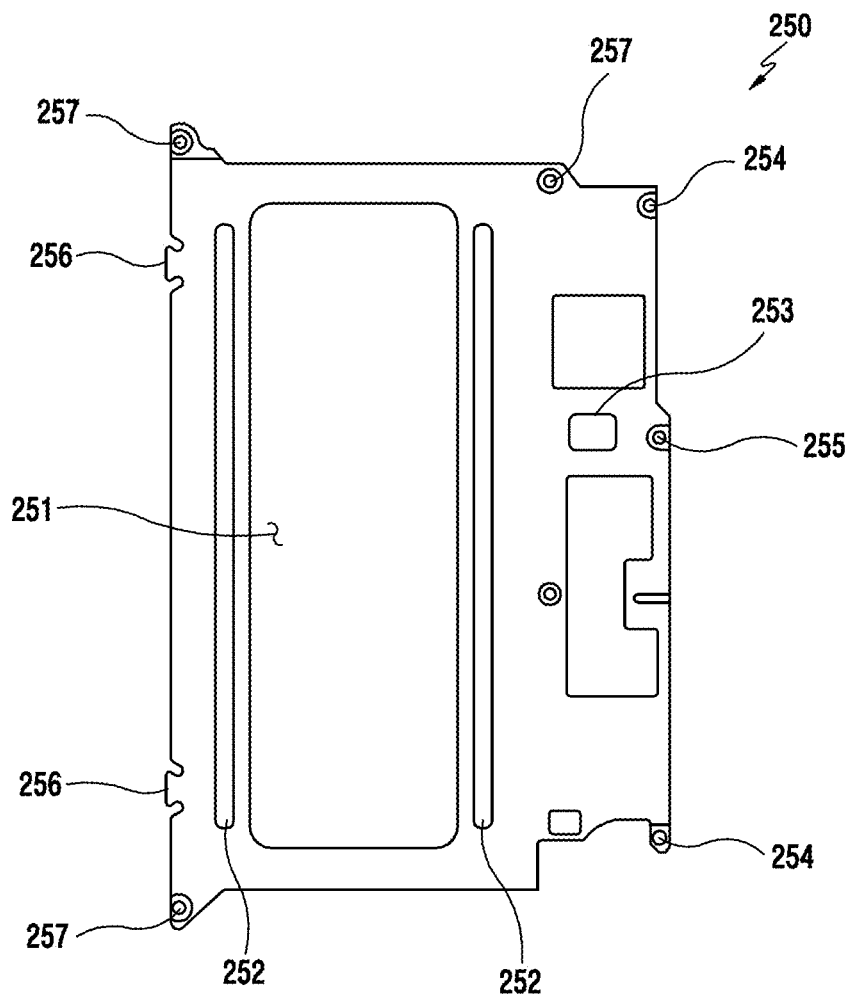
FIG. 4A illustrates a configuration of a heat dissipation plate according to various embodiments of the present disclosure.

FIG. 4A illustrates a configuration of a heat dissipation plate 250 according to various embodiments of the present disclosure.

Referring to FIG. 4A, the heat dissipation plate 250 may be formed of a plate type metallic member. According to one embodiment, the heat dissipation plate 250 may be formed of a Cu alloy that is relatively excellent in heat conductivity.

According to various embodiments, a Cu alloy-made heat dissipation plate 250, which is manufactured using Cu by weight of 90% or more according to an embodiment of the present disclosure, may ensure a relatively excellent heat conductivity compared to SUS304, S36(AL), or AZ91D (MG). According to one embodiment, the heat dissipation plate 250 may be formed to have a thickness in the range of 0.2 mm to 0.25 mm using a Cu alloy. According to various embodiments, in the case where the heat dissipation plate is exposed to the exterior of the electronic device, external coating, such as chrome (Cr) and/or painting, may be performed on the heat dissipation plate in order to improve corrosion resistance.

According to various embodiments, in the case where the heat dissipation plate 250 have a thickness in the above-mentioned range, various shapes may be disposed in order to improve the strength and corrosion resistance of the heat dissipation plate 250. According to one embodiment, various shapes of beads 252 and 253 may be formed on the heat dissipation plate 250. According to one embodiment, one or more beads 252 and 253 may be formed in the longitudinal direction, and may be formed in a rectangular shape. According to one embodiment, the longitudinal bead 252 may be disposed near the opening 251 in order to prevent the deformation of the heat dissipation plate 250 beforehand.

According to various embodiments, the heat dissipation plate 250 may include a plurality of fasteners 254, 255, and 257 to be fixed to the metal bezel 220 of the electronic device 200, the non-metallic member (an injection-molded product) 240, or the PCB 231 by screws. As illustrated in FIG. 4A, the plurality of fasteners may include board fasteners 254 and 255 that allow the heat dissipation plate 250 to be fastened to the PCB 231, injection-molded product fasteners 257 that allow the heat dissipation plate 250 to be fastened to an injection-molded product, and locking protrusions 256 that allow the heat dissipation plate 250 to be isolated from the metal bezel 220 and fixed.

According to one embodiment, the locking protrusions 256 may be disposed through a method of bending side faces of the heat dissipation plate 250, which is formed of a Cu alloy, and insert injection molding a non-metallic member (e.g., a PC). According to one embodiment, the locking protrusions 256 may be engaged to be locked to the inner faces of the metal bezel 220 so as to fix the heat dissipation plate 250 to the inside of the metal bezel of the electronic device 200.

Figure 4B:
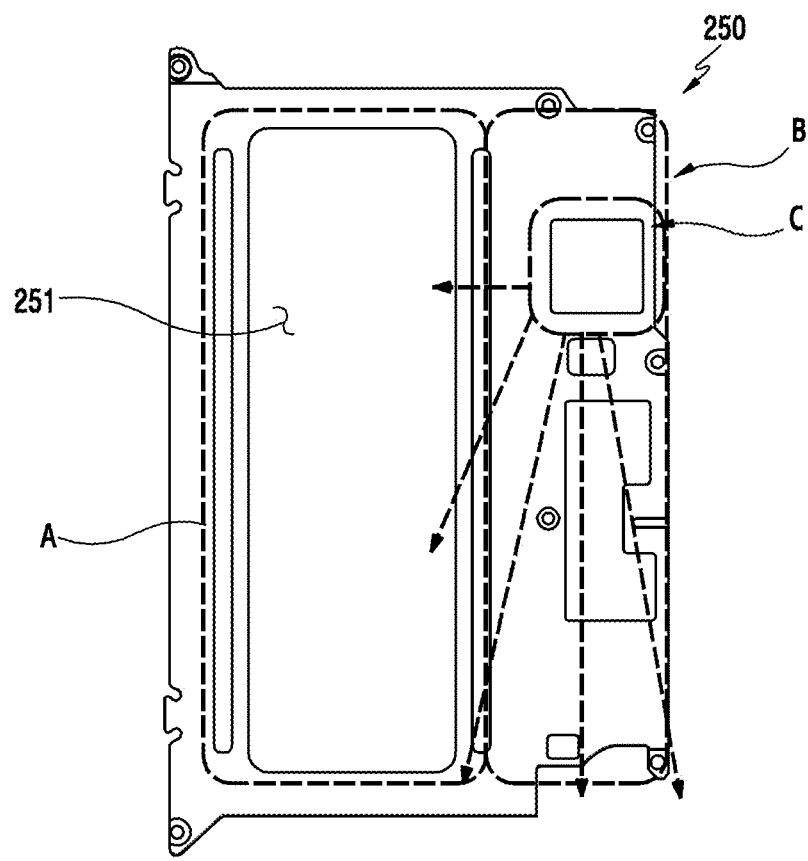
FIG. 4B illustrates a heat dissipation structure of the heat dissipation plate and an arranged state of an electronic component, according to various embodiments of the present disclosure.

FIG. 4B illustrates a heat dissipation structure of the heat dissipation plate 250 and an arranged state of an electronic component, according to various embodiments of the present disclosure.

Referring to FIG. 4B, the heat dissipation plate 250 may include an "A" region, in which a battery pack 230 is disposed, and a "B" region that is a region corresponding to the PCB 231 at one side of the "A" region. The "B" region may include a "C" region, which is a main heat generating region corresponding to a heat generating source that is mounted on the PCB 231. Accordingly, heat generated from the heat generating source of the PCB 231 may be transferred from the "C" region to the "B" region, dissipated to the "A" region, and then dissipated to the battery pack 230, thereby configuring an efficient heat generating structure.

Figure 5:
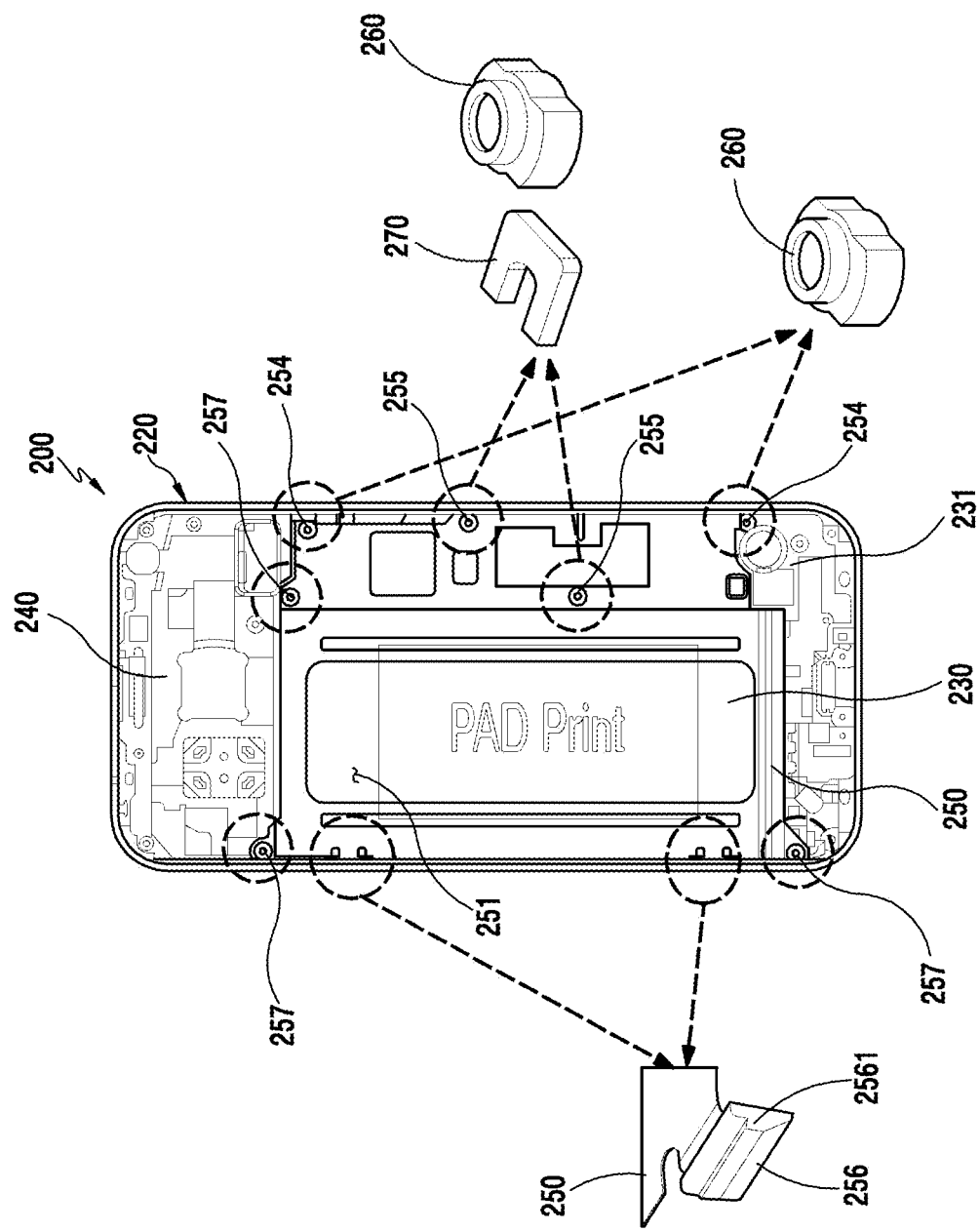
FIG. 5 illustrates a structure that allows a heat dissipation plate, according to various embodiments of the present disclosure, to be fastened to an electronic device.

FIG. 5 illustrates a structure that allows a heat dissipation plate 250, according to various embodiments of the present disclosure, to be fastened to an electronic device 200.

Referring to FIG. 5, the heat dissipation plate 250 may be fixed within the electronic device 200. In such a case, the locking protrusions 256 of the heat dissipation plate 250 may be fixed by being locked to the side faces 2201 (see FIG. 6B) of the metal bezel 220 by hooks 2561. According to one embodiment, the injection-molded product fasteners 257 of the heat dissipation plate 250 may be directly fastened to the heat dissipation plate 250 of the metallic material by screws. According to one embodiment, the PCB fasteners 254 and 255 of the heat dissipation plate 250 may be fixed by screws to be spaced apart from the metal bezel 220 by PEM® nuts 260. According to one embodiment, the PEM nuts 260 may be disposed between the PCB 231 and the metal bezel 220 so as to cause the metal bezel 220 and the PCB 231 to be spaced apart from each other. In such a case, the PEM nuts 260 may be processed to be spaced apart from the metal bezel 220 to be insulated from the metal bezel 220. According to one embodiment, an insulation function may be performed by diversifying the materials, positions, and structures of the PEM nuts. According to one embodiment, washers 270 may also be disposed between the PCB 231 and the heat dissipation plate 250 to be used for insulation and height correction of the heat dissipation plate 250.

Figure 6A:
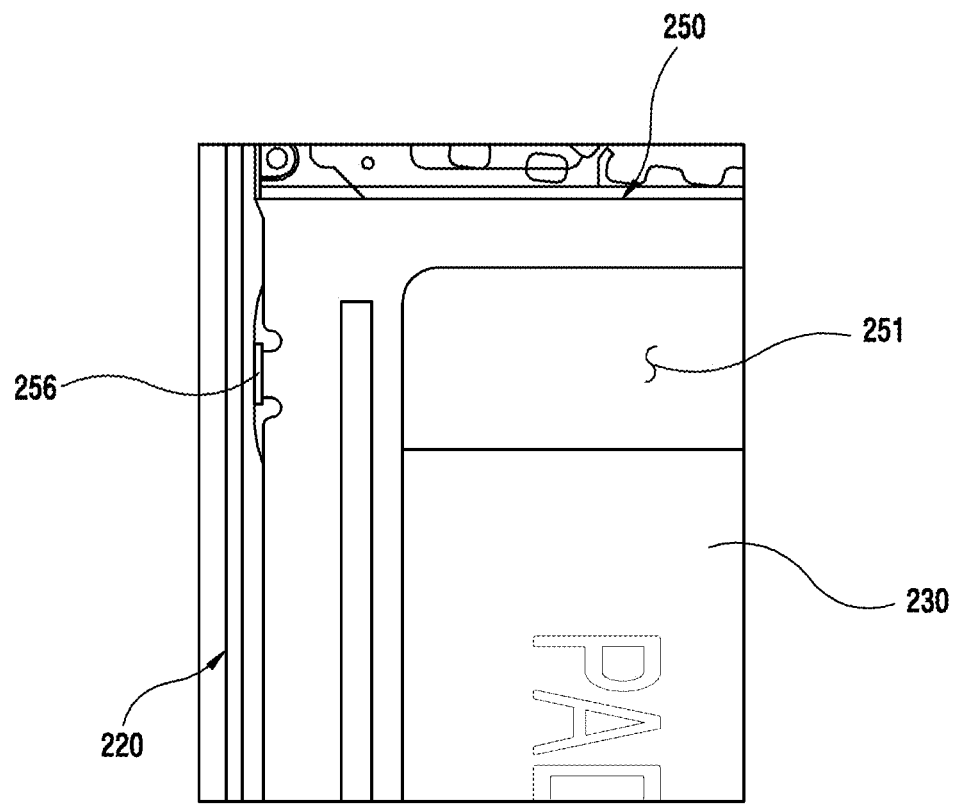
FIGS. 6A to 6C illustrate a side mounting structure of a heat dissipation plate, according to various embodiments of the present disclosure.
Figure 6B:
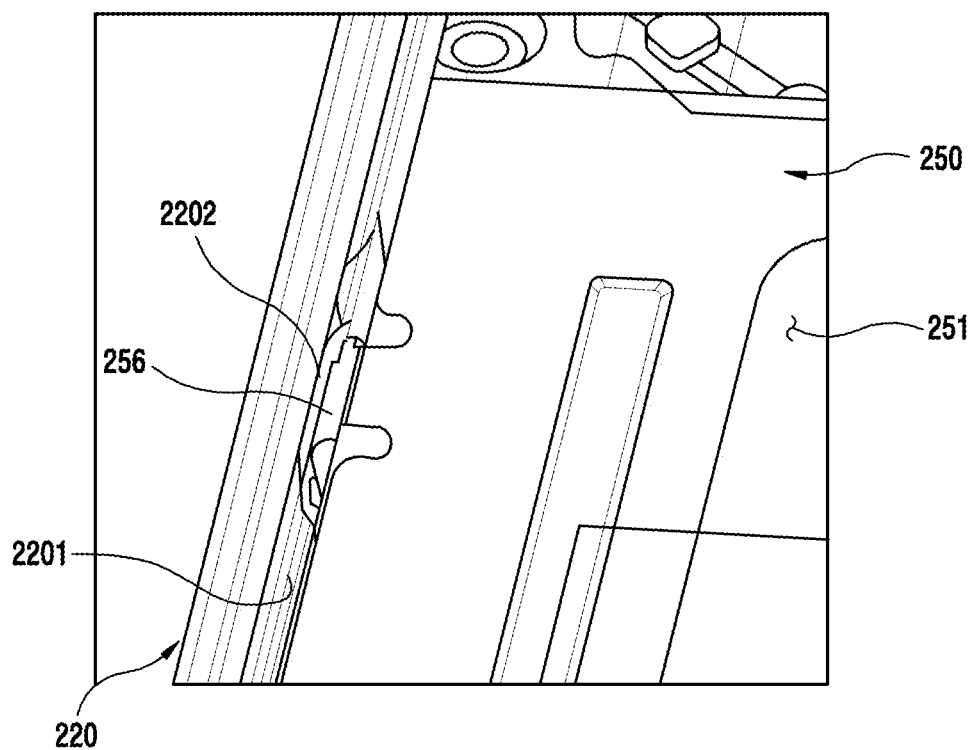
Figure 6C:
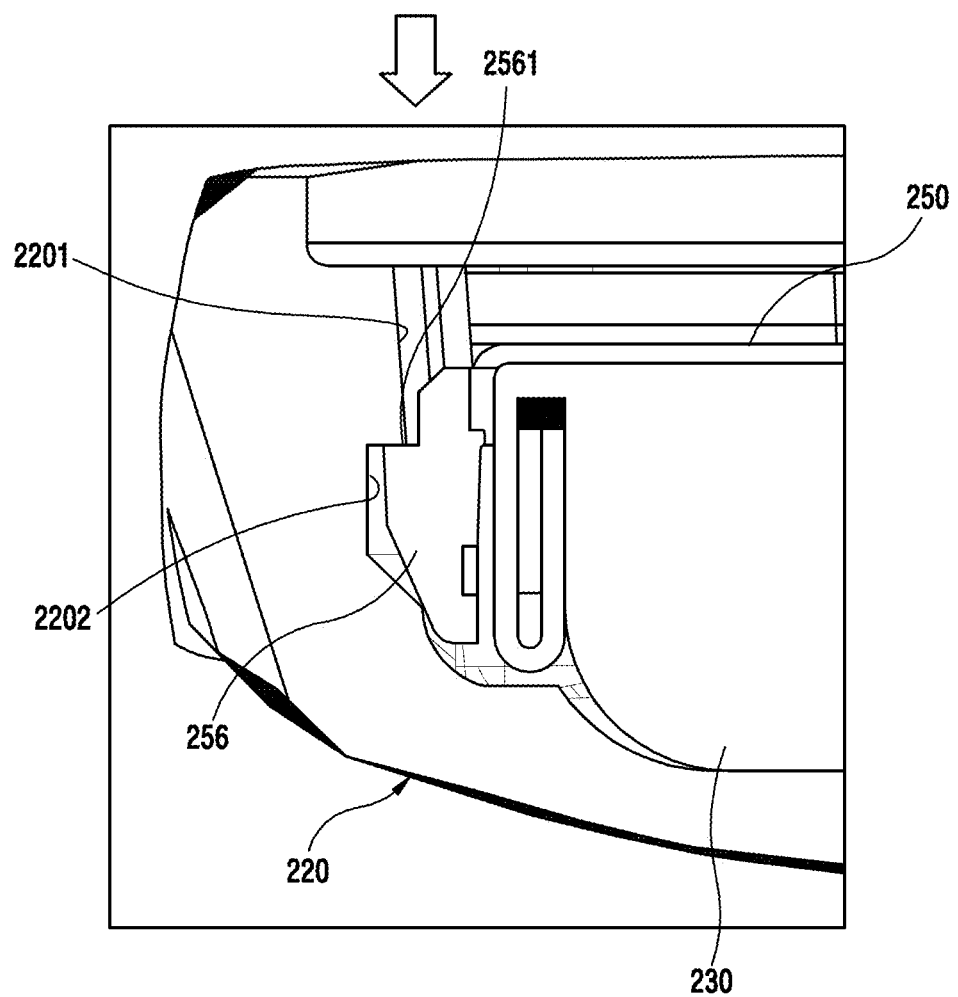

FIGS. 6A to 6C illustrate a side mounting structure of a heat dissipation plate 250, according to various embodiments of the present disclosure.

Referring to FIGS. 6A to 6C, the heat dissipation plate 250 may include a locking protrusion 256 that is molded, through insert injection molding using a non-metallic member, in a region that is formed by being bent along the rim of the heat dissipation plate 250. According to one embodiment, the locking protrusion 256 may include a hook 2561 in the outward direction. According to one embodiment, the locking protrusion 256 may be disposed in the manner of insert injection molding a non-metallic member of a PC material in an opening that is formed in a vertically bent region in the rim of the heat dissipation plate 250.

According to various embodiments, a locking recess 2202, to which the locking protrusion 256 is capable of being locked, may be formed at a corresponding position on the internal face 2201 of the metal bezel 220. Accordingly, merely with the operation of mounting the heat dissipation plate 250 in a direction indicated by an arrow in FIG. 6C, the locking protrusion 256 of the heat dissipation plate 250 may be coupled to the locking recess 2202 of the metal bezel 220 as a snap fit structure. According to one embodiment, such a coupling structure may contribute to maintaining the assembled state of the heat dissipation plate 250 without being moved before the heat dissipation plate 250 is fastened by screws to fastening portions.

According to various embodiments, since the heat dissipation plate 250 may be disposed in such a manner of being at least partially in contact with the PCB 231, the state in which the metal bezel 220 and the side face of the heat dissipation plate 250 are spaced apart from each other is maintained by the locking protrusion 256 of the non-metallic material (insulating material). Therefore, it is possible to prevent an electric shock accident that may be caused when the power applied to the PCB 231 is applied to the metal bezel 220.

Figure 7A:
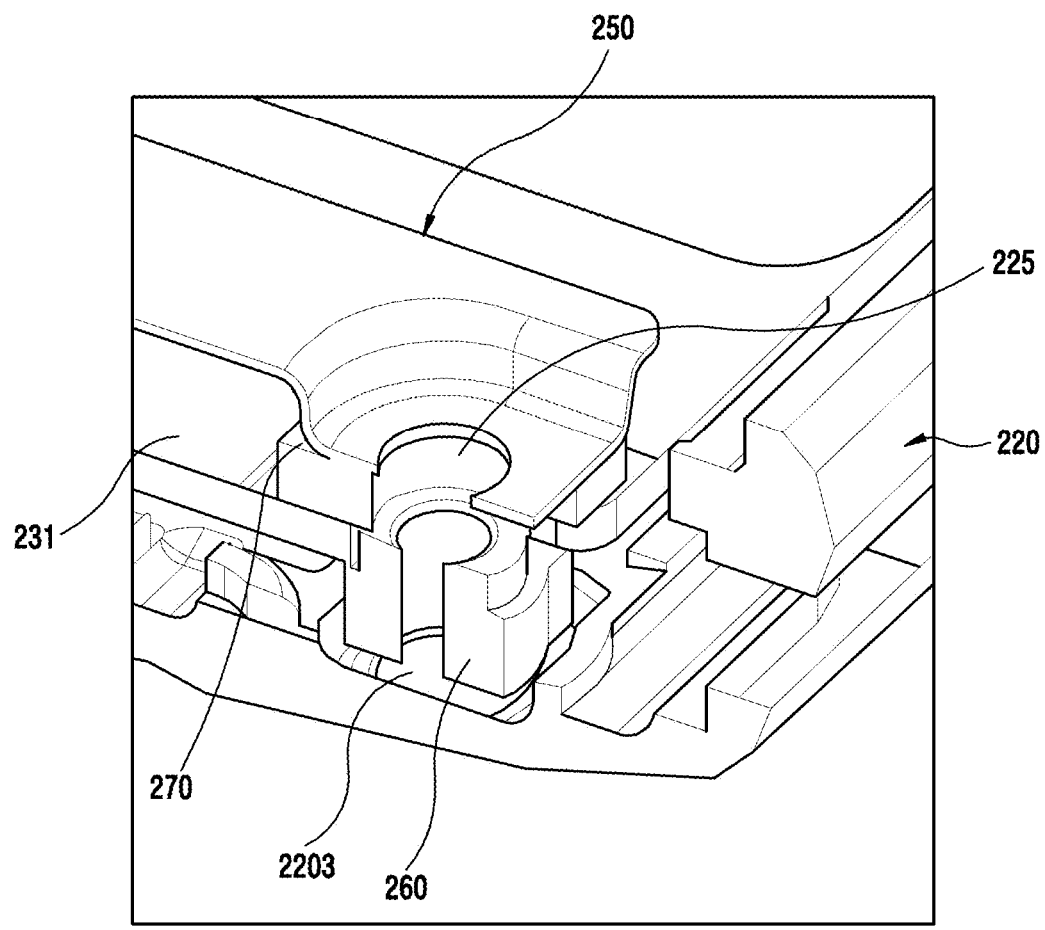
FIGS. 7A to 7B illustrate a screw fastening structure of a heat dissipation plate, according to various embodiments of the present disclosure.
Figure 7B:
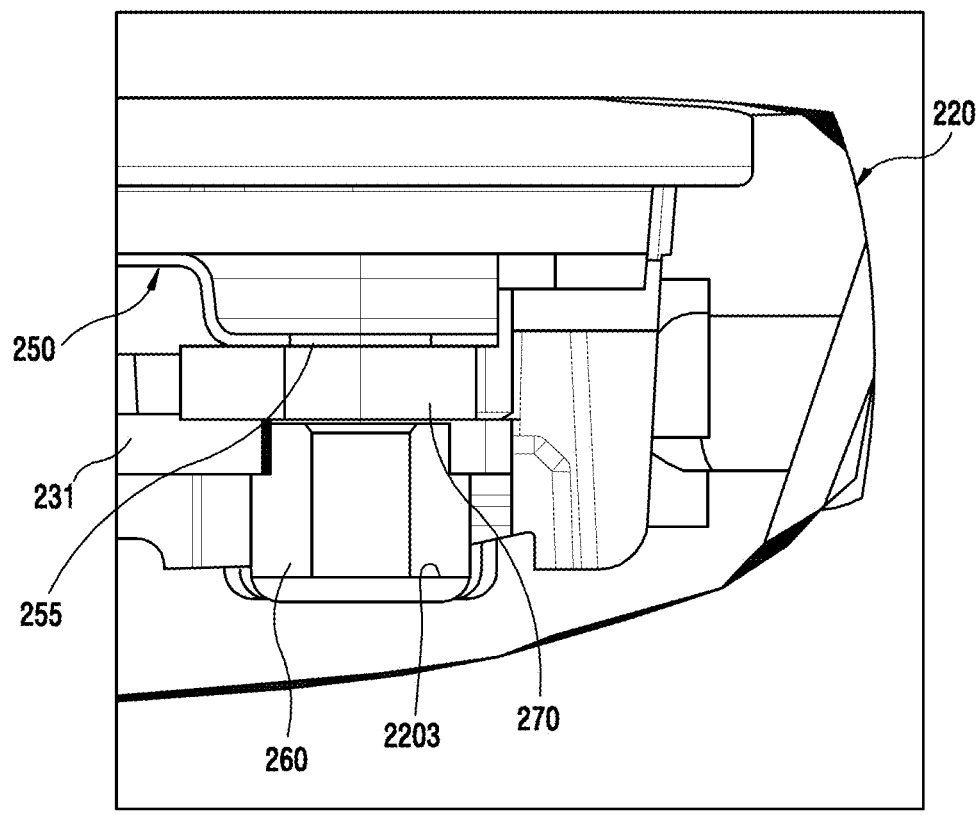

FIGS. 7A and 7B illustrate a screw fastening structure of a heat dissipation plate 250, according to various embodiments of the present disclosure.

According to various embodiments, a PEM nut fixing portion 2203 may be formed on the bottom surface of the metal bezel 220. According to one embodiment, a PEM nut 260 may be fixed to the PEM nut fixing portion 2203 such that the PEM nut 260 protrudes to a predetermined height from the bottom surface of the metal bezel 220. According to one embodiment, the bottom side of the PEM nut 260 may be subjected to an insulating treatment in order to electrically insulate the PEM nut 260 from the metal bezel 220.

According to various embodiments, a PCB 231 may be stacked on the upper portion of the PEM nut 260. According to one embodiment, since the PCB 231 may be supported by the PEM nut 260 that protrudes to a predetermined height from the bottom surface of the metal bezel 220, the PCB 231 may be practically installed to be spaced apart from the metal bezel 220 by the thickness of the metal bezel 220 and the protrusion length of the PEM nut 260.

According to various embodiments, the heat dissipation plate 250 may be stacked on the top of the PCB 231. According to one embodiment, a PCB fastener 255 of the heat dissipation plate 250 may be located at a position that corresponds to the PEM nut 260. Accordingly, a screw may penetrate the PCB 231 through the PCB fastener 255 of the heat dissipation plate 250, and then may be fastened to the PEM nut 260.

According to various embodiments, a washer 270 may be further interposed between heat dissipation plate 250 and the PCB 231. According to one embodiment, the washer 270 may be formed of an insulating material, and may cause the heat dissipation plate 250 and the PCB 231 to be spaced apart from each other by the height of the washer 270. With this configuration, it is possible to cut off the power, which may be applied by an FPCB of a display module stacked on the top of the heat dissipation plate 250 and may be applied to the battery pack 230 that is in contact with the heat dissipation plate 250, thereby preventing an electric shock accident beforehand.

Figure 8:
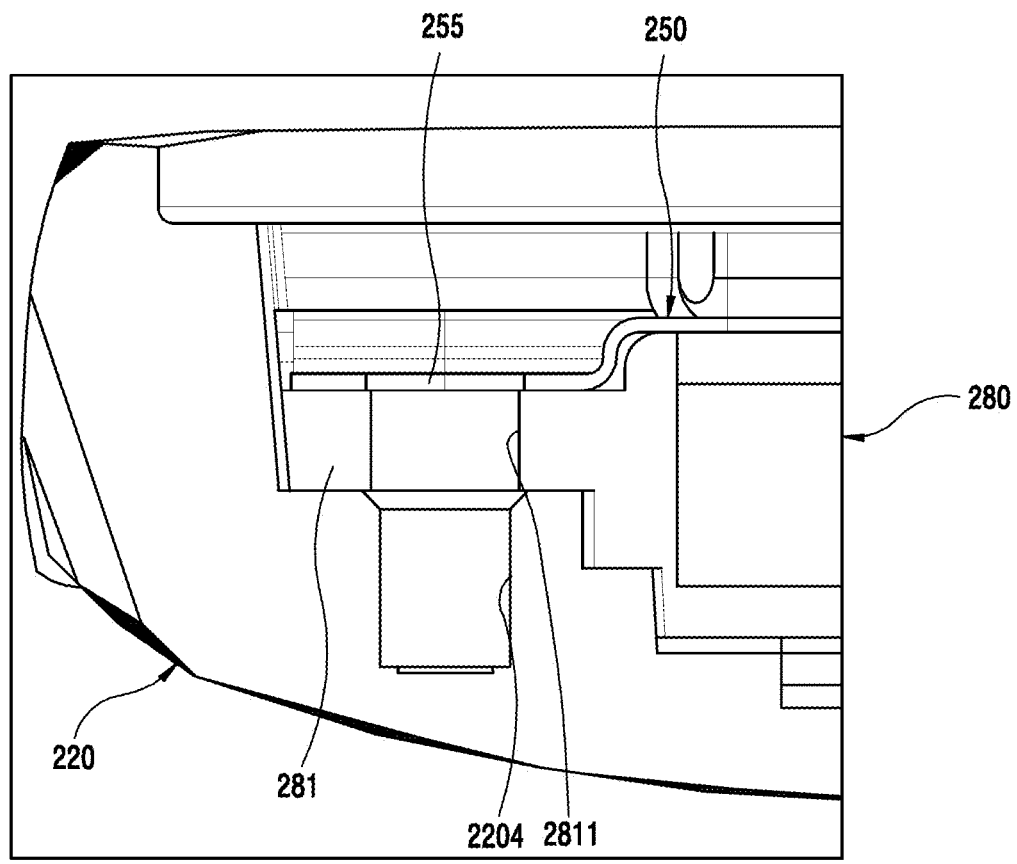
FIG. 8 illustrates a cross-sectional view of a main portion, illustrating an insulation arrangement relationship of a heat dissipation plate by an enclosure that accommodates electronic components, according to various embodiments of the present disclosure.

FIG. 8 is a cross-sectional view of a main portion, illustrating an insulation arrangement relationship of a heat dissipation plate by an enclosure that accommodates electronic components, according to various embodiments of the present disclosure.

Referring to FIG. 8, even if the above-mentioned PEM nut 260 or washer 270 is not added in order to insulate the heat dissipation plate 250 and the metal bezel 220 from each other, the insulation may be implemented by using an electronic component accommodation enclosure 280 that is essentially required in order to accommodate electronic components that are used in an existing electronic device.

According to various embodiments, the enclosure 280 made of an insulating material (e.g., PC, rubber, or urethane) may include a spacing portion 281 that extends to a side. According to one embodiment, the spacing portion 281 may include a through-hole 2811. According to one embodiment, a screw fastening portion 2204 may be formed in the bottom surface of the metal bezel 220, and the spacing portion 281 of the enclosure 280 may be disposed such that the through-hole 2811 corresponds to the screw fastening portion 2204. According to one embodiment, the heat dissipation plate 250 may be disposed at the upper side of the spacing portion 281 in a manner of being stacked. According to one embodiment, the fastener 255 of the heat dissipation plate 250, the through-hole 2811 of the spacing portion 281, and the screw fastening portion 2204 may be disposed at mutually corresponding positions, and the screw, which is inserted from the upper side of the heat dissipation plate 250, may pass through the fastener 255 and the through-hole 2811 of the spacing portion 281, and then may be fastened to the screw fastening portion 2204 of the metal bezel 220. In such a case, the screw may be formed of an insulating material, or an insulating member may be applied to the outer surface of the screw. Accordingly, since the metal bezel 220 is maintained in the state where it is spaced apart from the heat dissipation plate 250 by the spacing portion 281 of the enclosure 280 to be electrically isolated from the heat dissipation plate 250, the power, which is applied to the PCB 231 and the heat dissipation plate 250, may be cut off so that an electric shock accident can be prevented beforehand. According to one embodiment, the enclosure 280 may include one or more various electronic components that are included in the electronic device. According to one embodiment, the electronic components may include at least one of a speaker device, a microphone device, an interface connector port, a vibration motor, a socket device, a key button assembly, various sensor modules, and a camera device.

Figure 9:
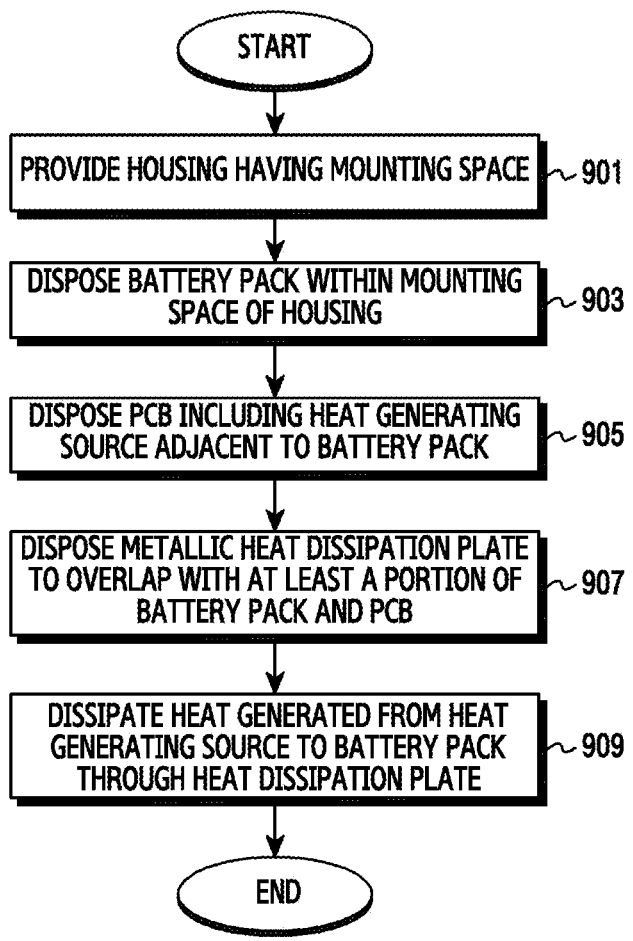
FIG. 9 illustrates an installation relationship of a heat dissipation structure according to various embodiments of the present disclosure.

FIG. 9 illustrates an installation relationship of a heat dissipation structure according to various embodiments of the present disclosure.

Referring to FIG. 9, in step 901, a housing having a mounting space may be provided. According to one embodiment, at least a portion of the housing may include a metallic member. Then, step 903 may be performed to dispose a battery pack in the mounting space of the housing. Then, a PCB may be disposed at a position adjacent to the battery pack. According to one embodiment, at least one heat generating source may be mounted on the PCB. According to one embodiment, the heat generating source may be an electronic component that is mounted on the PCB of the electronic device. Then, step 907 may be performed to dispose a heat dissipation plate of a metallic material to overlap with at least a portion of the battery pack and the PCB. According to one embodiment, the heat dissipation plate may be disposed at a position where it overlaps with the heat generating source, and at least one bead and/or at least one perforated portion may be formed in order to prevent deformation. Accordingly, in step 909, heat generated from the heat generating source may be dissipated to the battery pack through the heat dissipation plate.

An electronic device, according to various embodiments, has an efficient heat dissipation structure while contributing to the rigidity reinforcement and slimming of the electronic device, and can prevent an electric shock accident beforehand, which may be caused by the exterior of a metallic member.

Although the present disclosure has been described with an embodiment, various changes and modifications may be suggested to one skilled in the art. It is intended that the present disclosure encompass such changes and modifications as fall within the scope of the appended claims.

What is claimed is:

1. An electronic device comprising:
   a housing including a metallic member;
   a battery pack disposed in the housing;
   a substrate disposed adjacent to the battery pack and includes at least one heat generating source; and
   a heat dissipation plate disposed to overlap at least a portion of the battery pack and the substrate, and is formed of a metallic material,
   wherein the heat dissipation plate is configured to dissipate heat generated from the heat generating source to the battery pack or a peripheral structure through the heat dissipation plate, and
   wherein the heat dissipation plate and the housing further include at least one fastening structure for electric isolation from the metallic member.

2. The electronic device of claim 1, wherein the heat dissipation plate is formed of a Cu alloy.

3. The electronic device of claim 2, wherein the heat dissipation plate contains Cu by weight of 90% or more.

4. The electronic device of claim 1, wherein, in order to prevent deformation, the heat dissipation plate includes a formation of one of:
   at least one bead,
   at least one perforated portion, or
   the at least one bead and the at least one perforated portion.

5. The electronic device of claim 1, wherein:
   the heat dissipation plate forms at least a portion of an exterior of the electronic device, and
   a coating layer is formed on the heat dissipation plate by at least one of a chrome plating or a painting process.

6. The electronic device of claim 1, wherein the heat dissipation plate includes an opening that is formed in a region overlapping with the battery pack to accommodate a swelling of the battery pack.

7. The electronic device of claim 1, wherein the fastening structure includes:
   at least one locking protrusion of an insulating material, which is formed in a region that is faulted by bending along a rim of the heat dissipation plate; and
   a locking recess that is formed at a position corresponding to the locking protrusion on an inner face of a metal bezel, and
   wherein the heat dissipation plate is configured to be fixed to the housing by an operation of causing the locking protrusion to be locked to the locking recess.

8. The electronic device of claim 7, wherein the locking protrusion is formed by inserting injection molding using a non-metallic member of a synthetic resin material on the heat dissipation plate.

9. The electronic device of claim 1, wherein:
   the fastening structure further includes a fastening nut fixed on a surface of the metallic member of the housing at a predetermined height, and
   the substrate and the metallic member are electrically isolated from each other by the fastening nut.

10. The electronic device of claim 9, wherein a washer having a predetermined height is further interposed between the substrate and the heat dissipation plate.

11. The electronic device of claim 10, wherein a screw is fastened to the fastening nut through the heat dissipation plate, the washer, and the substrate.

12. The electronic device of claim 10, further comprising:
    a display module disposed above the heat dissipation plate,
    wherein the washer is configured to cutoff power applied from the display module to the metallic member through the heat dissipation plate.

13. The electronic device of claim 1, wherein the fastening structure is configured to perform the electric isolation by interposing at least a portion of an enclosure, which accommodates at least one electronic component that is provided in the electronic device, between the metallic member of the housing and the heat dissipation plate.

14. The electronic device of claim 13, wherein the at least one electronic component includes at least one of: a speaker device, a microphone device, an interface connector port, a vibration motor, a socket device, a key button assembly, various sensor modules, or a camera device.

15. An electronic device comprising:
    a housing including a metallic member;
    a battery pack disposed in the housing;
    a substrate disposed parallel to the battery pack, the substrate including at least one heat generating source;
    a heat dissipation plate disposed above the battery pack and the substrate to overlap with at least a portion of the battery pack and the substrate, the heat dissipation plate formed of a Cu alloy; and
    at least one insulation fastening member for electric isolation from the metallic member, the at least one insulation fastening member interposed:
    between the substrate and the metallic member of the housing, or
    between the substrate and the heat dissipation plate,
    wherein the heat dissipation plate is configured to dissipate heat generated from the heat generating source to the battery pack through the heat dissipation plate.

16. The electronic device of claim 15, wherein the at least one insulation fastening member includes:
    at least one locking protrusion of an insulating material, the locking protrusion formed in a region that is formed by bending along a rim of the heat dissipation plate; and
    a locking recess that is formed at a position corresponding to the locking protrusion on an inner face of a metal bezel, and
    wherein the heat dissipation plate configured to be fixed to the housing by an operation of causing the locking protrusion to be locked to the locking recess.

17. The electronic device of claim 15, wherein the at least one insulation fastening member includes:
    a fastening nut fixed to the metallic member of the housing at a predetermined height; and a washer that has a predetermined height and is interposed between the substrate and the heat dissipation plate, and wherein the substrate and the metallic member are electrically isolated from each other by the fastening nut, and wherein the washer is configured to cut off power applied to the metallic member through the heat dissipation plate.

18. The electronic device of claim 17, wherein a screw is fastened to the fastening nut through the heat dissipation plate, the washer, and the substrate.

19. The electronic device of claim 15, wherein the at least one insulation fastening member is configured to electrically isolate by interposing at least a portion of an enclosure, which accommodates at least one electronic component that is provided in the electronic device, between the metallic member of the housing and the heat dissipation plate.

\* \* \* \* \*